United States Patent [19]

Ingram et al.

[11] Patent Number: 4,746,055

[45] Date of Patent: May 24, 1988

[54] METHOD AND CONNECTING MATERIAL FOR THE METALLIC JOINING OF PARTS

[75] Inventors: Peter Ingram, Hemsbach; Bernd Jahnke, Neckargemuend; Arno Neidig, Plankstadt, all of Fed. Rep. of Germany

[73] Assignee: Brown, Boveri & Cie AG, Mannheim, Fed. Rep. of Germany

[21] Appl. No.: 71,561

[22] Filed: May 22, 1987

Related U.S. Application Data

[63] Continuation of Ser. No. 811,944, Dec. 20, 1985, abandoned.

[30] Foreign Application Priority Data

Dec. 21, 1984 [DE] Fed. Rep. of Germany ....... 3446780

[51] Int. Cl.$^4$ .................. B23K 31/02; B23K 35/26
[52] U.S. Cl. .................................. 228/122; 228/123; 228/263.12; 228/56.3
[58] Field of Search .................. 228/263.12, 198, 56.3, 228/122, 123, 194, 195

[56] References Cited

U.S. PATENT DOCUMENTS

| Re. 30,348 | 7/1980 | Hascoe | 228/56.3 |
| 2,354,409 | 7/1944 | Strasser | 228/56.3 |
| 3,254,393 | 6/1966 | Grasser | 228/122 |
| 3,392,899 | 7/1968 | Hoogstoel | 228/56.3 |
| 3,651,562 | 3/1972 | Hambleton | 228/123 |
| 3,787,958 | 1/1974 | Freedman et al. | 228/122 |
| 4,529,836 | 7/1985 | Powers et al. | 228/123 |

FOREIGN PATENT DOCUMENTS

| 72756 | 6/1978 | Japan | 228/123 |
| 406660 | 5/1974 | U.S.S.R. | 228/263.12 |

Primary Examiner—Nicholas P. Godici
Assistant Examiner—Samuel M. Heinrich
Attorney, Agent, or Firm—Herbert L. Lerner; Laurence A. Greenberg

[57] ABSTRACT

Method for the metallic joining of parts which are formed by semiconductor components with metallization on at least one side or by metallic components or metallic substrates. A composite multilayer material is arranged between the parts to be joined together. Subsequently, the components are joined together at least under the action of defined heat such that only the surface layers directly facing the parts of the composite material are softened.

5 Claims, 1 Drawing Sheet

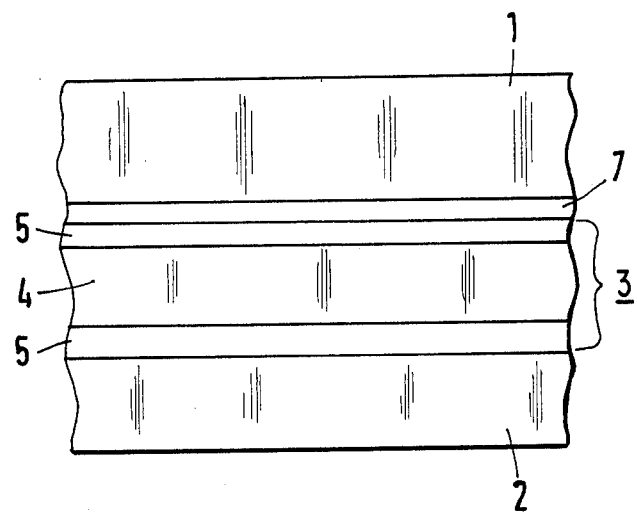

METHOD AND CONNECTING MATERIAL FOR THE METALLIC JOINING OF PARTS

This application is a continuation of application Ser. No. 811,944, filed Dec. 20, 1985, now abandoned.

BACKGROUND OF THE INVENTION

1. Field of the Invention

The invention relates to a method for the metallic joining of component parts which are formed of semiconductor components with metallization on a surface, metallic components or metallic substrates, as well as to a connecting (bonding) material for carrying out the method.

2. Description of the Prior Art

Such a method finds application preferably in joining semiconductor components and substrates. A large number of connecting materials, especially soft solder materials, are known, by which semiconductor components are joined to each other or to their substrates or other elements at a temperature of 180° to 350° C. Although soft-soldering has the substantial advantage that it has high integrability as compared to so-called pressure contacts, problems arise in power semiconductors with continuously flowing limit currents of more than 100A due to the poor alternating-load resistance of the joint. Greatly different thermal coefficients of expansion of the materials used, for instance, silicon, ceramics and copper, lead under stress to plastic deformations which generate disadvantageous structural changes in the solidified solder material. Pores and voids which can form during the solidification of the solder, especially if the partners to be joined are insufficiently wetted by the solder, accelerate the number of rejects. In addition, brittle phases which greatly reduce the strength, are formed at the boundary surfaces of the parts to be joined (for instance, copper or the metallization layers of the active semiconductor elements such as CrNiAg), due to the great supply of liquid solder (approximately 0.1 mm of solder).

SUMMARY OF THE INVENTION

It is therefore an object of the invention to provide a method and a connecting material, by which parts in the form of metallized semiconductor components as well as metallic components and metallized substrates can be joined together durably and operably.

With the forgoing and other objects in view, there is provided in accordance with the invention a method for the metallic joining of component parts which are formed of semiconductor components with metallization on a surface, metallic components or metallic substrates, which comprises; arranging component parts with their metallic surfaces to be joined facing each other, inserting a composite multilayer material of at least three layers with the two outer layers designated surface layers and the internal layer designated core layer, between the metallic surfaces to be joined, and joining the component parts with the inserted composite multilayer material by heating to effect melting of the surface layers of the composite multilayer material directly facing the metallic surfaces to be joined without melting an interior layer of the composite multilayer material.

In accordance with the foregoing, there is provided a composite metallic connecting material for the metallic joining of component parts which are formed of semiconductor components with metallization on a surface, metallic components or metallic substrates, comprising a core layer formed by a metallic foil which is coated on both sides with a metallic surface layer.

Other features which are considered as characteristic for the invention are set forth in the appended claims.

Although the invention is illustrated and described herein as embodied in a method and connecting material for the metallic joining of parts, it is nevertheless not intended to be limited to the details shown, since various modifications may be made therein without departing from the spirit of the invention and within the scope and range of equivalents of the claims.

BRIEF DESCRIPTION OF THE DRAWING

The invention, however, together with additional objects and advantages thereof will be best understood from the following description when read in connection with the accompanying drawing which diagrammatically illustrates a semiconductor component having a metallized side to be joined to a metallic part of molybdenum by means of a multi-layer connecting material having a core layer of lead and surface layers of tin, which connecting material is arranged between the two parts to be joined.

DESCRIPTION OF THE PREFERRED EMBODIMENTS

The invention relates to a method for the metallic joining of parts which are formed of semiconductor components with an at least one-sided metallization or of metallic components. According to the invention, a multi-layer connecting material of metal is arranged between the parts. The connecting material has a core layer of lead or an alloy of tin, antimony and silver. This core layer is 20 to 60 $\mu$m thick and is coated on both sides with a surface layer, for instance, of tin. The two surface layers have a thickness between 0.2 and 2 $\mu$m. The parts are soldered together by the method according to the invention at a temperature of about 180° to 350° C. Optionally, the soldering may be aided by applying pressure.

In the soldering method according to the invention, a composite multilayer material is placed in the joining zone, which can be stressed thermally, mechanically and is resistant to corrosion. The connecting material has a metallic top layer which with a thin region of 1 to 5 $\mu$m of the core layer forms a liquid, but at the very least an easily deformable solder layer. The connecting material enters into a strong bond with the parts to be joined together. According to the invention, a connecting material is used which is built up from at least three layers. The core layer consists of lead or an alloy of tin and/or antimony with silver. Other materials may be used for forming the core layer such as an oxide-precipitation hardened alloy or amorphous alloy. The material exhibits the required alternating-load strength or the desired long-term strength. The core layer should have a thickness of 20 to 60 $\mu$m. The surfaces of this core layer facing the components are covered with a surface layer which has a thickness of between 0.5 and 2 $\mu$m and either has a melting point lower than the core layer, or the surface layer such as tin forms with the core layer a lower-melting eutectic. If semiconductor components or semiconductor components and metallic components are joined together by the method according to the invention, the semiconductor components are provided on their side facing the connecting material with a metallization which is preferably formed by an alloy of aluminum-chromium-nickel and silver or a nickel-silver alloy. Thereby, an optimum bond between the surface layer of tin of the connecting material and the semiconductor component is created. The thickness of the surface layer used for carrying out the method is matched to the components to be joined together such that the liquefying region is initially solidified largely isothermically at the soldering temperature, especially at a temperature between 180° and 350° C. due to diffusion processes. If a core layer is used as described above, it develops, in a narrow region, with the two tin layers applied thereto a lead-tin eutectic, with which the soldering process proper is carried out. Due to the low tin concentration during the mixing and the outward diffusion, the isothermic solidification is brought about in a short time. The advantageous structure of the core layer made of lead is largely preserved since it does not melt except for a marginal zone of about 2 to 5 μm. Due to the low alloy concentration in the melted "solder zone", only few brittle phases occur. With the method according to the invention, the connecting material used for carrying out the soldering method is matched to the components to be joined, preventing thereby the occurrence of wetting problems. If the joining is carried out by using heat and simultaneously pressure, the melting of the edge zone may be dispensed with entirely through a slight rubbing motion. In this case, one has solid-body welded joints, where the surface layer of the connecting (bonding) material such as tin is plastically deformable and a metallic bond occurs due to sufficient proximity of the partners to be joined together in the atomic range.

The method according to the invention will be explained in the following by means of an embodiment example.

The sole figure shows a semiconductor component 1 which is joined to a metallic part 2, using the method according to the invention. The semiconductor component 1 is provided on its side facing the part 2 with a metallization 7 which, in the embodiment example shown here, is formed by an aluminum, chromium, nickel, silver alloy. The metallization may also be formed by a nickel-silver compound or another metallic layer. The metallic part to be joined to semiconductor component 1 is made of molybdenum. Components of other metallic materials regardless of what kind can also be joined to a semiconductor component by the method according to the invention if the coefficients of expansion permit this combination. For carrying out the method, a metallic multi-layer connecting material 3 is arranged between the components 1 and 2 to be joined. The former has a core layer 4 which, in the embodiment example shown here, consists of lead. It has a thickness of between 20 and 60 μm. Instead of a core layer of lead 4, a core layer can also be used which is made of a tin, antimony, silver alloy or of oxide precipitation-hardened or amorphous alloys. Other materials for forming the core layer 4 may be used instead of the above-mentioned materials. These materials merely must meet the necessary conditions, especially the desired alternating-load strength and/or the long-life strength.

A surface layer 5 of tin is applied to the two surfaces of this core layer 4 facing the components 1 and 2. The two surface layers 5 have a thickness of 0.5 to 2 μm. After this connecting material 3 is arranged between the two components 1 and 2, the semiconductor component 1 is soldered to the metallic part 2. To this end, the arrangement shown in the figure is heated to a temperature of between 180° and 350° C. Exerting pressure on the two components can be helpful for an optimum joint, and this can be accomplished by pushing a pressure plunger each, not shown here, against the outward-directed boundary surfaces of the semiconductor component 1 and the metallic part 2. Under the action of the above-mentioned heat and pressure, a melting of the two surface layers 5 comes about. The core layer 4 melted only in a very thin edge zone. The depth of the melted edge zone in the core layer is 1 to 5 μm. If the core layer is made of pure lead, the formation of a lead-tin eutectic in this narrow edge zone comes about, by which the soldering process takes place. Due to the low tin concentration during the mixing and the diffusion, isothermic solidification comes about after a short time, since lead diffuses into the tin region and vice-versa and thereby, the liquidus and solidus point of the resulting alloy is raised. The structure of the core layer made of lead is substantially preserved.

The melting of the solder can also be dispensed with. The basic layer and junction design then remains identical with that shown in the drawing. The core layer 4 consists of lead or a lead alloy or a silver-tin-antimony alloy. The coating 5 on both sides consists of a thin, plastically readily deformable layer of lead-tin or lead-silver or pure tin with a thickness of 1 to 5 μm, depending on the temperature exposure.

The joining process of the components 1 and 2 with the intermediate composite layer 3 is a pure solid-body diffusion-welding process. It can be carried out by ultrasonic friction welding under the action of temperature (thermosonic bonding), or exclusively under the action of temperature and pressure (thermo-compression welding).

The foregoing is a description corresponding, in substance, to German application No. P 34,46,780.7, dated Dec. 21, 1984, international priority of which is being claimed for the instant application and which is hereby made part of this application. Any material discrepancies between the foregoing specification and the specification of the aforementioned corresponding German application are to be resolved in favor of the latter.

There is claimed:

1. Method for the metallic joining of component parts which are formed of semiconductor components with metallization on a surface, metallic components or metallic substrates, which comprises:
  (a) arranging component parts with their metallic surfaces to be joined facing each other,
  (b) inserting between the metallic surfaces to be joined a composite multilayer material of at least three layers, with a core layer formed solely from a metallic foil made of lead, with a thickness of 20 to 60 μm and coated on both sides with a surface layer of tin with a thickness between 0.5 and 2 μm forming a lower melting eutectic with the internal layer surface, and
  (c) joining the component parts with the inserted composite multilayer material at a temperature of 180° C. to 350° C. to effect melting of the surface layers of the compsite multilayer material directly facing the metallic surfaces to be joined without melting or only melting the rim of the interior layer of the composite multilayer material.

2. A method for the metallic joining of component parts which are formed of semiconductor components with metallization on a surface, metallic components or metallic substrates, which comprises:

(a) arranging component parts with their metallic surfaces to be joined facing each other, (b) inserting between the metallic surfaces to be joined a composite multilayer material of at least three layers, with a core layer formed solely from a metallic foil made of an alloy of tin with silver, with a thickness of 20 to 60 μm, and coated on both sides with a surface layer of tin with a thickness between 0.5 and 2 μm forming a lower melting eutectic with the internal layer surface, and (c) joining the component parts with the inserted composite multilayer material at a temperature of 180° C. to 350° C. to effect melting of the surface layers of the composite multilayer material directly facing the metallic surface to be joined without melting or only melting the rim of the interior layer of the composite multilayer material.

3. Method for the metallic joining of component parts which are formed of semiconductor components with metallization on a surface, metallic components or metallic substrates, which comprises:

(a) arranging component parts with their metallic surfaces to be joined facing each other, (b) inserting between the metallic surfaces to be joined a composite multilayer material of at least three layers, with a core layer formed solely from a metallic foil made of an alloy of antimony with silver with a thickness of 20 to 60 μm and coated on both sides with a surface layer of tin with a thickness between 0.5 and 2 μm forming a lower melting eutectic with the internal layer surface, and (c) joining the component parts with the inserted composite multilayer material at a temperature of 180° C. to 350° C. to effect melting of the surface layers of the composite multilayer material directly facing the metallic surfaces to be joined without melting or only melting the rim of the interior layer of the composite multilayer material.

4. Method for the metallic joining of component parts which are formed of semiconductor components with metallization on a surface, metallic components or metallic substrates, which comprises:

(a) arranging components part with their metallic surfaces to be joined facing each other, (b) inserting between the metallic surfaces to be joined a composite multilayer material of at least three layers, with a core layer formed solely from a metallic foil made of an alloy of tin and antimony with silver with a thickness of 20 to 60 μm and coated on both sides with a surface layer of tin with a thickness between 0.5 and 2 μm forming a lower melting eutectic with the internal layer surface, and (c) joining the component parts with the inserted composite multilayer material at a temperature of 180° C. to 350° C. to effect melting of the surface layers of the compsite multilayer material directly facing the metallic surfaces to be joined without melting or only melting the rim of the interior layer of the composite multilayer material.

5. Method for the metallic joining of component parts which are formed of semiconductor components with a metallization which is formed by an alloy of aluminum-chromium-nickel-silver or a nickel-silver alloy on a surface, metallic components or metallic substrates of molybdenum, which comprises:

(a) arranging component parts with their metallic surfaces to be joined facing each other, (b) inserting between the metallic surfaces to be joined a composite multilayer material of at least three layers, with a core layer formed solely from a metallic foil made of lead, with a thickness of 20 to 60 μm and coated on both sides with a surface layer of tin with a thickness between 0.5 and 2 μm forming a lower melting eutectic with the internal layer surface, and (c) joining the component parts with the inserted composite multilayer material at a temperature of 180° C. to 350° C. to effect melting of the surface layers of the composite multilayer material directly facing the metallic surfaces to be joined without melting or only melting the rim of the interior layer of the composite multilayer material.

* * * * *